United States Patent

Boerner et al.

[11] Patent Number: 6,165,631
[45] Date of Patent: Dec. 26, 2000

[54] DIODE-ADDRESSED COLOR DISPLAY WITH LANTHANOID PHOSPHORS

[75] Inventors: Herbert Boerner; Thomas Jüstel; Hans Nikol, all of Aachen, Germany

[73] Assignee: U.S. Philips Corporation, New York, N.Y.

[21] Appl. No.: 09/185,005

[22] Filed: Nov. 3, 1998

Related U.S. Application Data

[63] Continuation of application No. PCT/IB98/00268, Mar. 3, 1998.

[30] Foreign Application Priority Data

Mar. 4, 1997 [DE] Germany .................... 197 08 562
Jan. 14, 1998 [DE] Germany .................... 198 00 983

[51] Int. Cl.$^7$ .................... H01L 33/00; H05B 33/00
[52] U.S. Cl. .................... 428/690; 428/917; 313/500; 313/501; 313/502; 313/503; 313/512; 257/89; 257/98; 257/100; 257/103
[58] Field of Search .................... 428/690, 917; 313/500, 501, 502, 503, 512; 257/88, 89, 98, 99, 100, 103

[56] References Cited

U.S. PATENT DOCUMENTS 5,898,185  4/1999  Bojarczuk, Jr. et al. ............... 257/103
6,051,925  4/2000  Boerner et al. ........................ 313/503
6,084,250  7/2000  Jüstel et al. .............................. 257/89

FOREIGN PATENT DOCUMENTS

WO9839807  9/1998  WIPO .

OTHER PUBLICATIONS

Junji Kido et al., "Bright red light–emitting . . . having a europium complex as an emitter", Appl. Phys. Lett. 65(17), pp. 2124–2126, Oct. 24, 1994.

Takeshi Sano et al., "Novel Europium Complex . . . with Sharp Red Emission", Jpn. J. Appl. Phys. vol. 34, Pt. 1, No. 4A, pp. 1883–1887, Apr. 1995.

"Full–Color Fluorescent Display Devices Using a Near–UV Light–Emitting Diode" by Yuchi Sato, Nobuyuki Takahashi and Susumu Sato, Jpn. J. Appl. Phys. vol. 35, pp. L838–839, (Jul., 1996).

*Primary Examiner*—Marie Yamnitzky
*Attorney, Agent, or Firm*—John C. Fox

[57] ABSTRACT

A diode-addressed color display comprising an UV-diode and a phosphor of the general formula $LnL_3X_2$, wherein $Ln=Eu^{3+}$, $Tb^{3+}$, $Tm^{3+}$, $Dys^{3+}$, $Sm^{3+}$, L=4-R-4'-benzophenone carboxylic acid, wherein R=phenyl, benzyl, $CH_3$, $CF_3$, $C_2H_5$, F, Cl, $OCH_3$, $CH_3CO$; 4-R-4'-benzophenone acetylacetonate, wherein R=phenyl, benzyl, $CH_3$, $CF_3$, $C_2H_5$, F, Cl, $OCH_3$, $CH_3CO$; 4-acetophenone carboxylic acid, 4-trifluoroacetophenone carboxylic acid, 4-acetophenone acetylacetonate or 4-trifluoroacetophenone acetylacetonate and X=½ phenanthroline, ½ diphenyl phenanthroline, ½ 4-Cl-phenanthroline, ½ bipyridine, ½ethylenediamine, triphenyl phosphineoxide, trimethyl phosphineoxide, triethyl phosphineoxide, ½ diethylene glycol-dimethylether (diglyme) or ethanol.

2 Claims, No Drawings

DIODE-ADDRESSED COLOR DISPLAY WITH LANTHANOID PHOSPHORS

This is a continuation of application Ser. No. PCT/IB98/00268, Mar. 3, 1998.

BACKGROUND OF THE INVENTION

The invention relates to a diode-addressed color display comprising an UV-diode and a phosphor for luminous representations, luminaries, solid state image intensifiers, display screens and monitors, and the like.

Color displays for luminous representations, luminaries, solid state image intensifiers, display screens and monitors should reproduce colored images in a color-sensitive manner. To achieve this, all color information about a colored image is represented by information about the three primary colors red, green and blue. By additive color mixing, any color, including white can be made from said three primary colors. This principle is employed by conventional color television receivers comprising a Braun tube as well as by the various flat-tube technologies, such as plasma display screen, electroluminescent display screen and LCD-displays. In other commercially available color displays, the color triad red, green and blue is generated by diode arrays comprising red, green and blue-emitting semiconductor diodes. In these color displays, however, the color-sensitive image reproduction, particularly the color-pure reproduction of green and blue is problematic. By virtue of the development of UV-emitting semiconductor diodes, the possibilities of a color-sensitive image reproduction for diode-addressed color displays has been increased, because, theoretically, any desired color of the visible light spectrum can be generated from UV-light. For this purpose, use is made of phosphors which absorb UV-light and reradiate it with a wavelength in the visible region. It is known that for this conversion of the UV-light into the visible region, use is made of inorganic pigments as phosphors. For example, it is known from Jpn. J. Appl. Phys. Vol. 35 (1996) pp. L838–839 to use ZnS:Ag, ZnS:Cu,Al and ZnCdS:Ag as the phosphors for converting the UV-light from UV-diodes in a fluorescent color display. These and other customary phosphors, such as $Y_2O_3$:Eu have a high quantum efficiency, but their absorption in the near-UV region, in which the UV-diodes emit, is very small.

OBJECTS AND SUMMARY OF THE INVENTION

Therefore, it is an object of the invention to provide a diode-addressed color display comprising an UV-diode and a phosphor, which phosphor has a high quantum efficiency and a high extinction coefficient in the near-UV wavelength range and enables a color-sensitive image reproduction to be achieved.

This object is achieved in accordance with the invention by a diode-addressed color display comprising an UV-diode and a phosphor of the general formula $LnL_3X_2$, wherein Ln=$Eu^{3+}$, $Tb^{3+}$, $Th^{3+}$, $Dys^{3+}$, $Sm^{3+}$, L=4-R-4'benzophenone carboxylic acid, wherein R=phenyl, benzyl, $CH_3$, $CF_3$, $C_2H_5$, F, Cl, $OCH_3$, $CH_3CO$; 4R-4'-benzophenone acetylacetonate, wherein R=phenyl, benzyl, $CH_3$, $CF_3$, $C_2OH_5$, F, Cl, $OCH_3$, $CH_3CO$; 4-acetophenone carboxylic acid, 4-trifluoroacetophenone carboxylic acid, 4-acetophenone acetylacetonate or 4-trifluoroacetophenone acetylacetonate and X=½ phenanthroline, ½ diphenyl phenanthroline, ½ 4-Cl-phenanthroline, ½ bipyridine, ½ ethylene diamine, triphenyl phosphineoxide, trimethyl phosphineoxide, triethyl phosphineoxide, ½diethylene glycol-dimethylether (diglyme) or ethanol.

Such a color display is distinguished by a high intrinsic emission-quantum efficiency and a ligand-centered absorption in the near-UV region and in the short-wave visible region between 320 and 450 nm with a high extinction coefficient. The UV-absorption has its maximum at 390 to 320 nm. After photophysical considerations, these two phosphor properties are mutually exclusive. Surprisingly, it has been found, however, that phosphors of the composition $LnL_3X_2$ meet both criteria. The phosphors in accordance with the invention having the "antenna molecules" L, which include benzophenone or acetophenone as structural elements exhibit an absorption capability which is a multiple of that of classic phosphors. A variation of the ligands L enables the substantially linear, independent introduction of high absorptions at different wavelengths in the lanthanoid compounds. Concentration quenching, which is a general problem with classic phosphors having a high activator concentration, is not observed in the phosphors in accordance with the invention. The phosphors in accordance with the invention are molecular compounds and hence, in general, readily soluble in polar organic solvents. As a result, their properties can be readily examined in solution and the results can be transferred to the solid state. The solubility in organic solvents additionally enables new design concepts for diode-addressed color displays to be developed.

Within the scope of the invention it is preferred that the diode-addressed color display comprises a transparent polymeric coating which contains the phosphor of the general formula $LnL_3X_2$ in solid solution. The coating is transparent because the light is not scattered at the dissolved phosphor particles.

DESCRIPTION OF THE PREFERRED EMBODIMENTS

These and other aspects of the invention will be apparent from and elucidated with reference to three embodiments described hereinafter.

A diode-addressed color display in accordance with the invention comprises an UV-emitting diode as the excitation source for UV-radiation and a phosphor of the general formula $LnL_3X_2$, wherein Ln=$Eu^{3+}$, $Tb^{3+}$, $Tm^{3+}$, $Dys^{3+}$, $Sm^{3+}$, L=4-R-4' benzophenone carboxylic acid, wherein R=phenyl, benzyl, $CH_3$, $CF_3$, $C_2H_5$, F, Cl, $OCH_3$, $CH_3CO$; 4-R-4'-benzophenone acetylacetonate, wherein R=phenyl, benzyl, $CH_3$, $CF_3$, $C_2H_5$, F, Cl, $OCH_3$, $CH_3CO$; 4-acetophenone carboxylic acid, 4-trifluoroacetophenone carboxylic acid, 4-acetophenone acetylacetonate or 4-trifluoroacetophenone acetylacetonate and X=½ phenanthroline, ½ diphenylphenanthroline, ½ 4-Cl-phenanthroline, ½ bipyridine, ½ ethylene diamine, triphenyl phosphineoxide, trimethyl phosphineoxide, triethyl phosphineoxide, ½ diethylene glycol-dimethylether (diglyme) or ethanol. The europium-containing or samarium-containing phosphors convert the UV-radiation into visible red light. The terbium-containing phosphor converts the UV-radiation into green light, the thulium-containing phosphor converts the UV-radiation into blue light and the dysprosium-containing phosphor converts the UV-radiation into bluish yellow mixed light.

The simplest color display in accordance with the invention is composed of the UV-diode and a transparent coating which is provided thereon and which comprises the phosphor. The transparent coating may, for example, comprise the phosphor in a solid solution in a transparent matrix of polyacrylate, polystyrene, epoxy resin or another polymer.

Since LEDs are mass-products, they are customarily embedded in epoxy housings, the molded-on lens of epoxy resin serving to improve the decoupling of light from the diode. In this embodiment, the phosphor can be provided as a contact layer between the actual diode and the epoxy-resin dome. The phosphor may alternatively be provided as a coating on the exterior of the epoxy-resin dome. In accordance with another embodiment, the phosphor is admixed with the epoxy resin and forms a solid solution therewith.

Large, two-dimensional displays can be readily manufactured in that a diode array is combined with the phosphor in accordance with the invention. For example, the diode array may be covered by a glass plate which is printed with phosphor triads which each have a red-luminescent, green-luminescent and blue-luminescent dot. The redluminescent dot comprises $LnL_3X_2$ as the phosphor. The UV-diode is, in particular, an UVdiode of InGaN or GaN and has its emission maximum in the range between 370 and 410 mn with a half-width value FWHM<50 nm.

The phosphors in accordance with the invention have the following general formula: $LnL_3X_2$, wherein $Ln=Eu^{3+}$, $Tb^{3+}$, $Tm^{3+}$, $Dys^{3+}$, $Sm^{3+}$, L=4-R-4'-benzophenone carboxylic acid, wherein R=phenyl, benzyl, $CH_3$, $CF_3$, $C_2H_5$, F, Cl, $OCH_3$, $CH_3CO$; 4-R-4'-benzophenone acetylacetonate, wherein R=phenyl, benzyl, $CH_3$, $CF_3$, $C_2H_5$, F, Cl, $OCH_3$, $CH_3CO$; 4-acetophenone carboxylic acid, 4-trifluoroacetophenone carboxylic acid, 4-acetophenone acetylacetonate or 4-trifluoroacetophenone acetylacetonate and X=½ phenanthroline, ½ diphenyl phenanthroline, ½ 4-Cl-phenanthroline, ½ bipyridine, ½ ethylenediamine, triphenyl phosphineoxide, trimethyl phosphineoxide, triethylphosphineoxide, ½ diethylene glycol-dimethylether (diglyme) or ethanol. These complex co-ordination compounds of the lanthanoids europium, terbium, thulium, dysprosium and samarium comprise $Eu^{3+}$, $Tb^{3+}$, $Tm^{3+}$, $Dys^{3+}$ and $Sm^{3+}$ as the metal center, benzophenone-4-carboxylic acid or the derivatives thereof, or benzophenone-4acetylacetonate or the derivatives thereof as charged ligands and phenanthroline, ½ diphenyl phenanthroline, ½ 4-Cl-phenanthroline, ½ bipyridine, ½ ethylenediamine, triphenyl phosphineoxide, trimethyl phosphineoxide, triethyl phosphineoxide, ½ diethylene glycoldimethylether (diglyme) or ethanol as the neutral ligands. These co-ordination compounds exhibit strong, optical intraligand transitions and, apart from the absorption of the chelate ligands, are also capable of effectively acting as light-sector antennae. The primary excitation by UV-radiation leads to a ligand-centered excited state whose energy will be transferred in a subsequent step to the lanthanoid ion where it leads to light emission. In these compounds, the original absorption properties of the ligands are substantially preserved and the interligand interactions are weak. The co-ordinative saturation of the lanthanoid precludes the tendency towards polymerization of the compounds which, as a result, are present in a mononuclear state. Consequently, unlike the phosphors in accordance with the state of the art, which are composed of host lattices doped with activator ions, here molecular phosphors are used.

EXAMPLE 1

To manufacture $Tb(C_{14}H_9O_3)_3(C_2H_5OH)_2$, a quantity of 1.0 mmol $TbCl_3$ aq in 10 ml ethanol is added to a solution of 3.0 mmol benzophenone-4-carboxylic acid (R=H) in 70 ml ethanol. Subsequently, 3.0 mmol $NaOCH_3$ are added and stirred for 2 hours at 60° C. The white precipitate is sucked off and washed with methanol and subsequently dried.

Upon excitation with radiation of 254 nm, a quantum yield of 70% was measured. The excitation spectrum shows that the phosphor can be excited up to 375 nm.

EXAMPLE 2

To manufacture $Tb(C_{14}H_9O_3)_3[(C_6H_5)_3PO]_2$, 1.0 mmol $Tb(C_{14}H_9O_3)_3(C_2H_5OH)_2$ and 2.3 mmol TPPO are stirred in 1,2-dichloroethane for 2 hours at 50° C. The previously insoluble powder slowly goes into solution. After the solution thus obtained has been filtered, it is suitable for direct further use and by adding a polymer such as polyacrylate or polystyrene it can be used to form a thin transparent coating for the UV-diode.

Excitation with radiation of 254 nm resulted in a quantum yield of 45%. The excitation spectrum shows that the phosphor can be excited up to 380 nm.

EXAMPLE 3

To manufacture $Eu(C_{14}H_9O_3)_3(C_{12}H_8N_2)_2$, 1.0 mmol $EuCl_3$ aq in 10 ml ethanol is added to a solution of 3.0 mmol benzophenone-4-carboxylic acid (R=H) in 70 ml ethanol. Subsequently, 3.0 mmol $NaOCH_3$ are added and stirred for 2 hours at 60° C. The white precipitate is sucked off, washed with methanol and dried. Subsequently, 1 mmol of the product and 1 mmol 1,10-phenanthroline are dissolved in 50 ml ethanol and the suspension is refluxed for 2 hours.

Excitation with radiation of 240 nm resulted in a quantum yield of 73%. The excitation spectrum shows that the phosphor can be excited up to 375 nm.

What is claimed is:

1. A diode-addressed color display comprising an UV-diode and a phosphor of the general formula $LnL_3X_2$, wherein $Ln=Eu^{3+}$, $Tb^{3+}$, $Tm^{3+}$, $Dys^{3+}$, $Sm^{3+}$, L=4-R-4'-benzophenone carboxylic acid, wherein R=phenyl, benzyl, $CH_3$, $CF_3$, $C_2H_5$, F, Cl, $OCH_3$, $CH_3CO$; 4-R-4'-benzophenone acetylacetonate, wherein R=phenyl, benzyl, $CH_3$, $CF_3$, $C_2H_5$, F, Cl, $OCH_3$, $CH_3CO$; 4-acetophenone carboxylic acid, 4-trifluoroacetophenone carboxylic acid, 4-acetophenone acetylacetonate or 4-trifluoroacetophenone acetylacetonate and X=½ phenanthroline, ½ diphenyl phenanthroline, ½ 4-Cl-phenanthroline, ½ bipyridine, ½ethylene diamine, triphenyl phosphineoxide, trimethyl phosphineoxide, triethylphosphineoxide, ½ diethylene glycol-dimethylether (diglyme) or ethanol.

2. A diode-addressed color display as claimed in claim 1, characterized in that the diode-addressed color display comprises a transparent polymeric coating which includes the phosphor of the general formula $LnL_3X_2$ in solid solution.

* * * * *